United States Patent

Relph

[11] Patent Number: 6,064,232
[45] Date of Patent: May 16, 2000

[54] SELF-CLOCKED LOGIC CIRCUIT AND METHODOLOGY

[75] Inventor: Richard Relph, Clara, Calif.

[73] Assignee: Advanced Micro Devices, Inc., Sunnyvale, Calif.

[21] Appl. No.: 08/992,634

[22] Filed: Dec. 18, 1997

[51] Int. Cl.[7] .................................................. H03K 19/00
[52] U.S. Cl. .................................. 326/93; 326/46; 326/21
[58] Field of Search .................................. 326/21, 46, 93, 326/96, 95, 98

[56] References Cited

U.S. PATENT DOCUMENTS

| | | |
|---|---|---|
| 4,929,850 | 5/1990 | Breuninger . |
| 5,033,066 | 7/1991 | DeVore . |
| 5,111,086 | 5/1992 | Back . |
| 5,132,572 | 7/1992 | Woo . |
| 5,220,216 | 6/1993 | Woo . |
| 5,227,679 | 7/1993 | Woo . |
| 5,229,668 | 7/1993 | Hughes, Jr. et al. . |
| 5,252,867 | 10/1993 | Sorrells et al. . |
| 5,264,745 | 11/1993 | Woo . |
| 5,289,518 | 2/1994 | Nakao ........................................ 326/93 |
| 5,321,368 | 6/1994 | Hoelzle ...................................... 326/93 |
| 5,349,612 | 9/1994 | Guo et al. . |
| 5,363,419 | 11/1994 | Ho . |
| 5,367,542 | 11/1994 | Guo . |
| 5,400,370 | 3/1995 | Guo . |
| 5,452,333 | 9/1995 | Guo et al. . |
| 5,457,336 | 10/1995 | Fang et al. . |
| 5,457,719 | 10/1995 | Guo et al. . |
| 5,565,798 | 10/1996 | Durham et al. ............................ 326/93 |
| 5,764,083 | 6/1998 | Nguyen et al. ............................ 326/93 |

FOREIGN PATENT DOCUMENTS

| | | |
|---|---|---|
| 0 453 171 A2 | 10/1991 | European Pat. Off. . |
| 41 37 340 C1 | 11/1992 | Germany . |

*Primary Examiner*—Jon Santamauro
*Assistant Examiner*—Don Phu Le

[57] ABSTRACT

A circuit and method for clocking for logic circuits use delay line techniques to time the clock signal. The inputs into a logic circuit are associated with a validity signal, which is delayed by a delay line for at least the propagation delay of the logic circuit. The delayed validity signal is used to latch an output signal produced by the logic circuit in response to the inputs.

18 Claims, 3 Drawing Sheets

SELF-CLOCKED LOGIC CIRCUIT AND METHODOLOGY

TECHNICAL FIELD

The present invention relates to sequential logic circuits and, more particularly, to a novel circuit and method for clocking a sequential logic circuit.

BACKGROUND ART

A salient feature of sequential logic circuits is memory. The output of a sequential logic circuit depends not only on the current values of applied input signals but also on the past circuit state, e.g. the sequence of previously applied input signals.

Sequential logic circuits can be asynchronous or synchronous. Asynchronous sequential circuits respond immediately to changes in input signals, yielding changed output signals. However, unequal propagation delays in asynchronous circuits can lead to hazards and race conditions.

To overcome these difficulties in asynchronous circuits, synchronous circuits are employed in which signals are latched into registers in response to regular clock pulses. The speed of synchronous circuits, however, is constrained by the period of the clock cycles, which depends on the propagation delays of logic blocks and registers.

For example, FIG. 3 depicts a synchronous circuit including two blocks of combinational logic: a first logic block 302 for computing a function "F" based on "N" inputs $I_1$–$I_N$ and a second logic block 306 for computing a function "G" based on "M" inputs $F_1$–$F_M$. The circuit also includes three registers 300, 304, and 308 for latching bits at the beginning of each clock cycle.

When "N" bits are latched in register 300 at the beginning of a clock cycle, they are applied as inputs $I_1$–$I_N$ to the first logic block 302 after some propagation delay for the register 300. The first logic block 302 computes the function "F" on the input bits and produces therefrom "M" bits of output $F_1$–$F_M$. These output bits $F_1$–$F_M$ are applied to a register 304, which latches those bits in response to the clock signal at the next clock cycle.

After the bits $F_1$–$F_M$ are latched by register 304, they are applied the second logic block 306. In response, the second logic block 306 computes the function "G" based on the bits $F_1$–$F_M$ and produces therefrom "L" bits of output $G_1$–$G_L$. These output bits $G_1$–$G_L$ are applied to register 306 and latched in response to the clock signal at the next clock cycle. Thus, the computation of functions "F" and "G" takes two clock cycles to complete.

Since conventional practice tends to use a common clock signal throughout a digital circuit, the clock period is set slower than the slowest logic block. Since most functions in the circuit are faster than the slowest logic block, there is much time wasted in the digital circuit waiting for the common clock signal.

In the example, let us assume that registers 300, 304, and 308 have a propagation delay of 7 ns, the first logic block 302 has a propagation delay of 21 ns, and the second logic block 306 has a propagation delay of 28 ns. Thus, the computation in the first clock cycle needs at least 28 ns to complete (7 ns for the register 300 to latch+21 ns for first logic block 302). The computation in the second clock cycle, on the other hand, requires at least 35 ns to complete before the data is ready to be latched by register 308 (7 ns for the register 304+28 ns for the second logic block 306). Since registers 300, 304, and 308 share a common clock signal, the clock period is set to 35 ns. Thus, the total time taken to perform the two computations, i.e. two clock cycles, is 70 ns. However, 7 ns of the first clock period of 35 ns was spent waiting for the next clock cycle. Therefore, digital functions are conventionally cascaded at the speed of the common clock, which is slower than cascading at the speed of most of the functions themselves.

DISCLOSURE OF THE INVENTION

There is a need to improve the speed of sequential circuits. There is also need to provide a circuit and method for clocking registers in a sequential circuit at the speed of logical functions.

These and other needs are met by the present invention in which the clocking for logic circuits is self-timed using delay line techniques. Specifically, each input into a logic block or circuit is associated with a validity signal. The validity signal is delayed by a delay line for at least, but preferably within 140 ps of, the propagation delay of the logic block. Thus, the delayed validity signal can be used to latch an output signal produced from the logic block in response to the inputs.

Accordingly, one aspect of the invention is a self-clocked logic circuit comprising a logic circuit responsive to an input signal, including one or more input bits, for producing an output signal from the input signal after a propagation delay. A first validity signal is asserted when the input signal is valid, and a delay line, responsive to the first validity signal, produces a second validity signal after a period of time at least as long the propagation delay of the logic circuit, preferably within 140 ps. A register is configured to latch the output signal in response to the second validity signal.

Another aspect of the present invention is method of latching a output signal generated by a logic circuit in response to an input signal after a delay. The method includes the step of asserting a validity signal when the input signal is valid and delaying the validity signal for a period of time as least as long as the delay, preferably within 140 ps. The output signal is latched in response to the delay validity signal.

Additional objects, advantages, and novel features of the present invention will be set forth in part in the detailed description which follows, and in part will become apparent upon examination or may be learned by practice of the invention. The objects and advantages of the invention may be realized and obtained by means of the instrumentalities and combinations particularly pointed out in the appended claims.

BRIEF DESCRIPTION OF DRAWINGS

The present invention is illustrated by way of example, and not by limitation, in the figures of the accompanying drawings, wherein elements having the same reference numeral designations represent like elements throughout and wherein.

BEST MODE FOR CARRYING OUT THE INVENTION

A circuit and method for clocking a sequential circuit are described. In the following description, for purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

Self Clocked Logic

Figure 1:
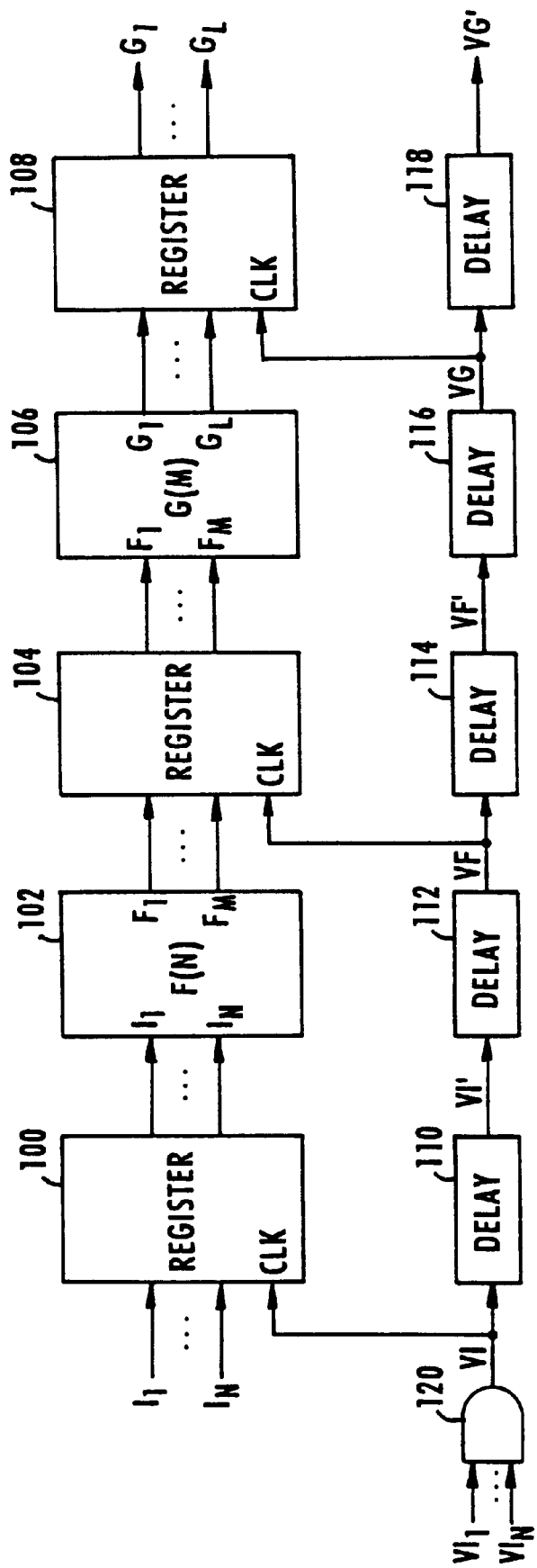
FIG. 1 is a high-level block diagram of a self-clocked logic circuit according to an embodiment of the present invention.
Figure 3:
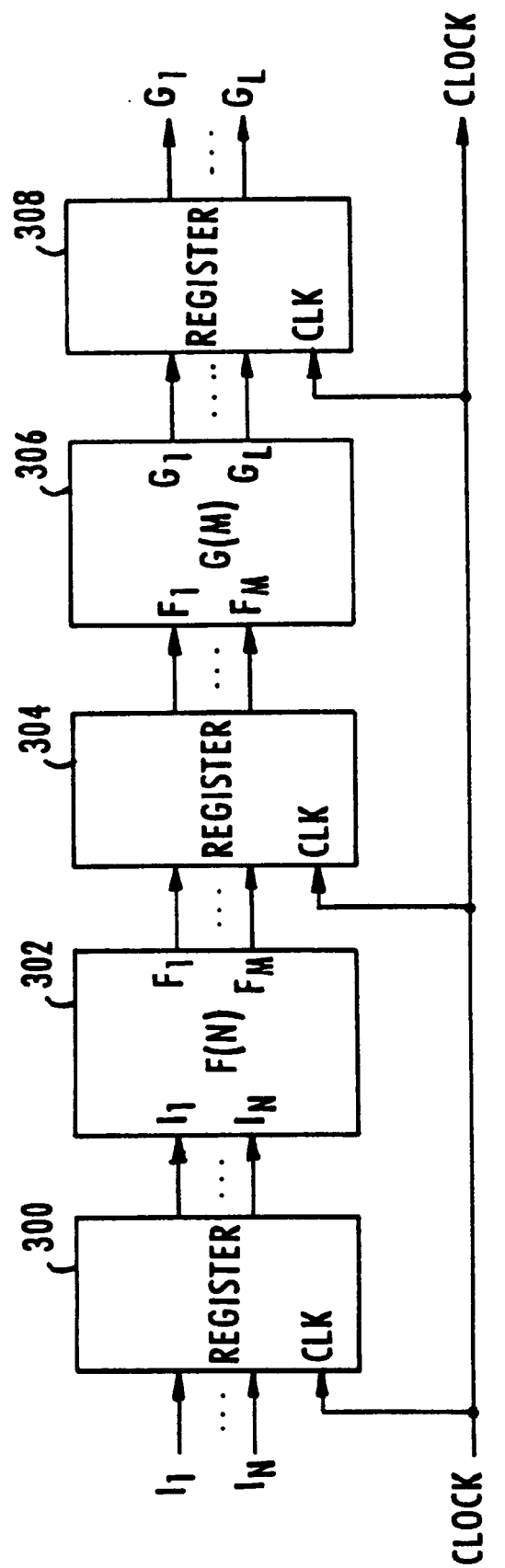
FIG. 3 is a high-level block diagram of a conventionally clocked logic circuit.

According to one embodiment of the present invention, FIG. 1 depicts a self-clocked sequential circuit corresponding to the conventional sequential circuit depicted in FIG. 3. Specifically, logic blocks 102 and 106 of FIG. 1 correspond to logic blocks 302 and 306 of FIG. 3, respectively. Registers 100, 104, and 108 of FIG. 1 correspond to registers 300, 304, and 308 of FIG. 3, respectively.

Thus, first logic block 102 computes the function "F" based on "N" inputs $I_1-I_N$, and second logic block 106 computes the function "G" based on "M" inputs $F_1-F_M$. The three registers 100, 104, and 108 latch bits applied thereto in response to the signals generated by the self-clocking circuitry including delay lines 110–118 and gate 120.

Associated with each bit of the input signal $I_1-I_N$ is a corresponding validity bit $VI_1-VI_N$ that is asserted when the associated input bit $I_1-I_N$ is valid. The validity bits $VI_1-VI_N$ may be produced asynchronously or synchronously when the input signal $I_1-I_N$ is first received from another circuit, e.g. an off-chip circuit. For example, some input signals are transmitted to an integrated circuit with a strobe that indicates that the inputs are ready. In this situation, the associated validity signal is derived from the strobe. In another example, the input signals are valid at every cycle of an externally supplied clock signal, in which case the associated validity signal would be derived from the clock signal. Validity signals associated with signals generated by internal, i.e. on-chip, logic blocks are derived from the self-clocking circuitry for respective internal logic blocks.

For the plurality of validity bits $VI_1-VI_N$, the self-clocking circuitry includes a gate 120, which determines when all the input bits $I_1-I_N$ for the corresponding register 100 are valid, i.e. when all the validity bits $VI_1-VI_N$ have been asserted. Gate 120 can be any circuitry which computes a logical product, such as an AND gate in positive logic or a NOR gate in negative logic.

The output of gate 120 is coupled to the "CLOCK" input of register 100, so that, when all the validity bits $VI_1-VI_N$ have been asserted, the resultant, consolidated input validity signal VI causes the register 100 to latch the input bits $I_1-I_N$. Thus, the input bits $I_1-I_N$ are latched only when all of the input bits $I_1-I_N$ are valid. In addition, the output of gate 120 is coupled to a delay line 110, which may be implemented as described in more detail hereinbelow.

When "N" bits are latched in register 100 in response to the input validity signal VI, they are applied as inputs $I_1-I_N$ to the first logic block 102 after some propagation delay for the register 100. Meanwhile, the input validity signal VI is delayed by delay line 110, configured to delay the input validity signal VI for a period of time at least as long as the propagation delay for the register 100. For example, if the register 100 has a propagation delay of 7 ns, then the delay line 100 would be configured to delay the input validity signal VI for at least 7 ns to produce a delayed input validity signal VI'.

The first logic block 102 computes the function "F" on the input bits and produces therefrom "M" bits of output $F_1-F_M$ after some propagation delay. Meanwhile, the corresponding delayed input validity signal VI' for the input bits $I_1-I_N$ is delayed by delay line 112, configured to delay the delayed input validity signal VI' for a period of time at least as long as the propagation delay of the first logic block 102. Thus, the output of the delay line 112 is asserted when the outputs of the corresponding first logic block 102 become valid. In other words, the output of the delay line 112 is a validity signal VF for the first logic block 102. In the example, if the first logic block 102 has a propagation delay of 21 ns, then the delay line 112 would be configured to delay the delayed input validity signal VI' for at least 21 ns to produce the first block validity signal VF.

Since the first block validity signal VF is produced by delay line 112 when the bits $F_1-F_M$ are valid, the first block validity signal VF is used to latch the bits $F_1-F_M$ at the register 104. After the bits $F_1-F_M$ are latched by register 304, they are applied the second logic block 306 after a propagation delay. Meanwhile, the first block validity signal VF is delayed by delay line 114, configured to delay the first block validity signal VF for a period of time at least as long as the propagation delay for the register 104. In the example, if the register 104 has a propagation delay of 7 ns, then the delay line 114 would be configured to delay the first block validity signal VP for at least 7 ns to produce a delayed first block validity signal VF'.

The second logic block 106 computes the function "G" based on the bits $F_1-F_M$ applied thereto and produces therefrom "L" bits of output $G_1-G_L$ after a propagation delay. Meanwhile, the corresponding delayed first block validity signal VF' for the bits $F_1-F_M$ is delayed by delay line 116, configured to delay the delayed first block validity signal VF' for a period of time at least as long as the propagation delay of the second logic block 106. Thus, the output of the delay line 116 is asserted when the outputs of the corresponding second logic block 106 become valid. In other words, the output of the delay line 116 is a validity signal VG for the second logic block 106. In the example, if the second logic block 106 has a propagation delay of 28 ns, then the delay line 116 would be configured to delay the delayed first block validity signal VF' for at least 28 ns to produce the second block validity signal VG.

Since delay line 116 is coupled to the "CLOCK" input of register 108, the output bits $G_1-G_L$ are latched by register 106 in response to the second block validity signal VG. Meanwhile, the second block validity signal VG is delayed by delay line 118, configured to delay the second block validity signal VG for a period of time at least as long as the propagation delay for the register 108. In the example, if the register 108 has a propagation delay of 7 ns, then the delay line 118 would be configured to delay the second block validity signal VG for at least 7 ns to produce a delayed second block validity signal VG'.

The time elapsed from when the input bits $I_1-I_N$ have become valid at register 100 until when the output bits $G_1-G_L$ are ready at register 108 is the sum of the propagation delays through first logic block 102, second logic block 106, and registers 100 and 104. In the example, this sum is 21 ns for the first logic block 102, 28 ns for the second logic block 106, and 7 ns for each register 100 and 104 for a total of 21 ns+28 ns+7 ns+7 ns=63 ns. Thus, this sequential circuit according to one embodiment of the present invention is able to latch the computation of functions "F" and "G" after 63 ns, in comparison with 70 ns for the conventionally clocked sequential circuit. In particular, the register latching the output of a faster logic block (e.g. register 104 and first logic block 102, respectively) is configured to latch the output immediately without having to wait a period of time synchronized with the a slower logic block (e.g. second logic block 106).

Digital Delay Line

Figure 2A:
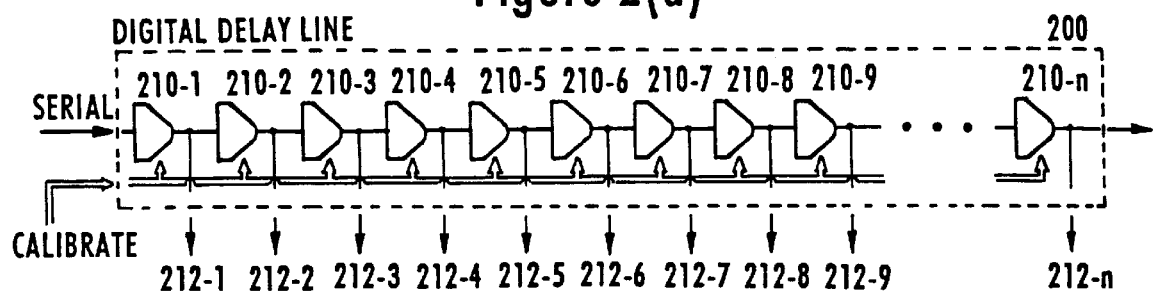
FIG. 2(a) is a block diagram of a delay line that may be used to implement the circuit depicted in FIG. 1.

FIG. 2(a) is a block diagram of an exemplary high-resolution, digital delay line 200 with which the present invention can be implemented. The exemplary high-resolution digital delay line 200 receives a bit and repeatedly delays the bit through a plurality of digital delay elements 210-1 to 210-n, coupled in series. Digital delay line 200 may comprise an arbitrary number n of digital delay elements, depending upon any constraints inherent in the semiconductor implementation utilized or other practical considerations. For example, digital delay line 200 can comprise tens of thousands of digital delay elements. Since each of the digital delay elements is 210-1 to 210-n of digital delay line 200 is constructed during the same manufacturing process on the same semiconductor substrate, it is likely that the operating characteristics, and hence the delay period, of each digital delay element are nearly identical.

Outputs of a plurality of digital delay elements may be tapped to simultaneously monitor the digital delay elements for a delayed bit. Accordingly, digital delay line 200 comprises a plurality of taps 212-1 to 212-n coupled to the outputs of the respective digital delay elements 210-1 to 210-n for monitoring portions of the digital delay line 200 in parallel.

Delay characteristics of any digital circuit will vary from chip to chip and over time because of unavoidable variations in manufacturing and operating conditions. Thus, there is a need to calibrate the delay period of each of the digital delay elements 210-1 to 210-n to match a specified period. According to one approach, both the delay period is synchronized to a reliable, precise reference clock, such as a crystal oscillator.

The delay period of each of the digital delay elements 210-1 to 210-n is preferably adjustable by a digital command code as a calibration signal. This calibration signal is produced with reference to a reliable, precise clock signal, preferably by an on-chip digital servo circuit (not shown) such as described in the commonly assigned U.S. Pat. No. 5,457,719, issued to Guo et al. on Oct. 10, 1995. Briefly, the on-chip digital servo circuit comprises an adjustable digital delay line of its own, which it monitors and continually adjusts with a calibration signal in a feedback loop. The calibration signal is shared with other systems on the chip.

Figure 2B:
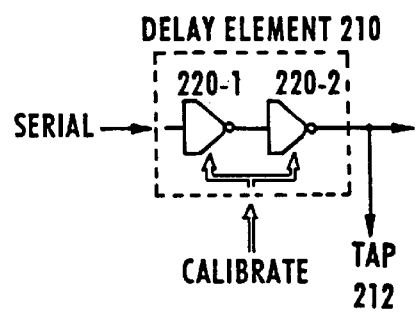
FIGS. 2(b) and 2(c) are circuit diagrams of a non-inverting delay stage and inverting delay stage that may be used to implement a delay stage depicted in FIG. 2(a).

Referring to FIG. 2(b), each adjustable digital is delay element 210 comprises two adjustable inverters 220-1 and 220-2, coupled in series, each receiving the aforementioned calibration signal. Thus, the delay period of each of the two adjustable inverters 220-1 and 220-2 is one-half of the delay period of the adjustable delay element and is controlled by the calibration signal.

Figure 2C:
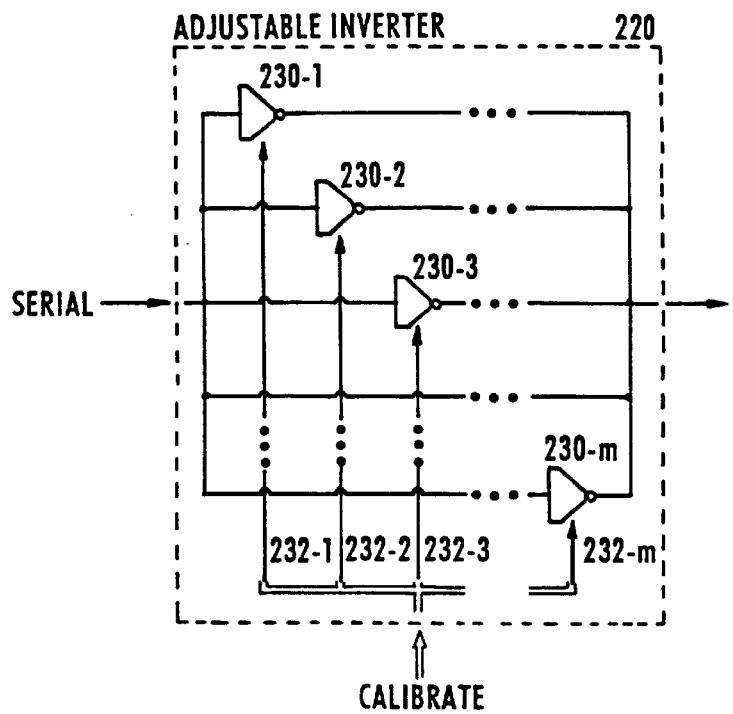

Referring to FIG. 2(c), each adjustable inverter 220 in a preferred embodiment comprises a plurality of switchable inverters 230-1 to 230-m coupled in parallel. Each of the switchable inverters 230-1 to 230-m is switched on or off by one of bits 232-1 to 232-m of the calibration signal. Thus, two of the parameters that determine the propagation delay of an inverter, the P-channel size to N-channel size ratio and the driving power, may be determined for precise control over the delay period. Switchable inverters are described in further detail in the commonly assigned U.S. Pat. No. 5,220,216, issued to Woo on Jun. 15, 1993, and the commonly assigned U.S. Pat. No. 5,227,679, issued to Woo on Jul. 13, 1993.

Accordingly, digital delay line 200 comprises a series of adjustable digital delay elements 210-1 to 210-n, each of which provides a uniform delay period synchronized to a reference clock period according to a calibration signal. Moreover, each adjustable inverter 220 can have a consistent delay period of as little as 70 ps. Thus, each adjustable digital delay element 210 can have a consistent delay period of as little as 140 ps.

The digital delay line 200 is implemented with enough adjustable digital delay elements of a particular delay period so that the total delay period exceeds the delay time of the worst case path through the corresponding logic circuit. For example, if the delay time of the worst case path through the logic circuit is 28 ns, then a minimum of 200 (28 ns/140 ps) adjustable delay elements having a 140 ps delay period is required. Thus, digital delay line 200 can be configured to delay a signal within 140 ps of a desired delay period.

The number of adjustable, delay elements can be reduced by using adjustable delay elements with a larger period. In fact, adjustable delay elements having different periods may be used, for example nineteen with a delay period of 1.4 ns and ten with a delay period of 140 ps.

In the configuration depicted in FIG. 1, it is evident that the series of delay lines 110–118 ultimately delay a single validity signal, viz. VI. Accordingly, the series of delay lines 110–118 may be replaced with a single delay line having appropriate taps coupled to respective "CLOCK" inputs of registers 104 and 108.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

What is claimed is:

1. A self-clocked logic circuit, comprising:
   a logic circuit responsive to an input signal for producing therefrom an output signal after a propagation delay;
   a delay line for delaying a first validity signal for a period of time at least as long as said propagation delay of the logic circuit to produce a second validity signal, said first validity signal being associated with said input signal and asserted when said input signal is valid; and
   a register for latching said output signal in response to said second validity signal.

2. The self-clocked circuit of claim 1, wherein:
   said input signal includes a plurality of input bits;
   said first validity signal includes a plurality of validity bits, said validity bits corresponding to respective input bits; and
   said delay line is arranged to produce said second validity signal after a period of time at least as long as said propagation delay when all of the plurality of validity bits are asserted.

3. The self-clocked circuit of claim 2, wherein said delay line includes an AND gate responsive to said plurality of validity bits.

4. The self-clocked circuit of claim 2, wherein said delay line includes a NOR gate responsive to said plurality of validity bits.

5. The self-clocked circuit of claim 1, further comprising another delay line responsive to second validity signal for producing a third validity signal after a period of time at least as long as a delay period of said register.

6. The self-clocked circuit of claim 1, wherein said delay line is arranged to produce said second validity signal within 140 ps of said propagation delay.

7. A self-clocked circuit, comprising:
   a logic circuit responsive to an input signal for producing therefrom an output signal after a propagation delay;
   a delay line responsive to a first validity signal for producing a second validity signal after a period of time at least as long as said propagation delay, said first validity signal being associated with said input signal and asserted when said input signal is valid, wherein said delay line includes a plurality of digital delay elements coupled in series; and
   a register for latching said output signal in response to said second validity signal.

8. The self-clocked circuit of claim 7, wherein:
   said delay line further includes a calibration input coupled for receiving a calibration signal; and
   each of the digital delay elements includes a calibration input for receiving the calibration signal for adjusting the delay period thereof.

9. The self-clocked circuit of claim 8, wherein each of the digital delay elements includes:
   a first adjustable inverter having a first calibration input for receiving the calibration signal; and
   a second adjustable inverter, coupled in series to said first adjustable inverter, and having a second calibration input for receiving said calibration signal.

10. The self-clocked circuit of claim 9, wherein a delay period of each of the digital delay elements is about 140 ps.

11. The self-clocked circuit of claim 7, wherein a delay period of each of the digital delay elements is the same.

12. A method of latching an output signal generated by a logic circuit in response to an input signal after a delay, said method comprising the steps of:
   asserting a validity signal when said input signal is valid;
   delaying said validity signal for a period of time at least as long as said delay of the logic circuit to produce a delayed validity signal; and
   latching said output signal in response to said delayed validity signal.

13. The method of claim 12, wherein:
   said input signal includes a plurality of input bits;
   the step of asserting a validity signal when said input signal is valid includes the steps of:
      asserting a plurality of valid bit signals when the respective input bits are valid; and
      generating said validity signal when each of the plurality of valid bit signals are asserted.

14. The method of claim 13, wherein the step of generating said validity signal when each of the plurality of valid bit signals are asserted includes the step of generating said validity signal as a logical product of said plurality of valid bit signals.

15. The method of claim 12, further comprising the step of delaying the delayed validity signal for another period of time at least as long as said step of latching consumes.

16. The method of claim 12, wherein the delaying said validity signal for a period of time at least as long as said delay includes the step of delaying said validity signal within 140 ps of said delay.

17. The method of claim 12, wherein the step of delaying said validity signal for a period of time at least as long as said delay includes the step of repeatedly delaying said validity signal by a common delay period.

18. A method of latching an output signal generated by a logic circuit in response to an input signal after a delay, comprising the steps of:
   asserting a validity signal when said input signal is valid;
   repeatedly delaying said validity signal by a common delay period totaling at least as long as said delay;
   latching said output signal in response to said delayed validity signal; and calibrating said common delay period.

* * * * *